(12) United States Patent
Liou et al.

(10) Patent No.: US 9,059,259 B2
(45) Date of Patent: Jun. 16, 2015

(54) HARD MASK FOR BACK-END-OF-LINE (BEOL) INTERCONNECT STRUCTURE

(71) Applicant: Taiwan Semiconductor Manufacturing Company Limited, Hsinchu (TW)

(72) Inventors: Joung-Wei Liou, Hsinchu County (TW); Han-Ti Hsiaw, Hsinchu County (TW); Keng-Chu Lin, Ping-Tung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 19 days.

(21) Appl. No.: 13/946,166

(22) Filed: Jul. 19, 2013

(65) Prior Publication Data

US 2015/0021779 A1 Jan. 22, 2015

(51) Int. Cl.
*H01L 21/4763* (2006.01)
*H01L 21/768* (2006.01)
*H01L 23/48* (2006.01)

(52) U.S. Cl.
CPC .... *H01L 21/76883* (2013.01); *H01L 21/76814* (2013.01); *H01L 23/48* (2013.01)

(58) Field of Classification Search
USPC ......... 438/637, 638, 639, 640, 668, 629, 666; 257/E21.578, E21.585–E21.588
See application file for complete search history.

(56) References Cited

U.S. PATENT DOCUMENTS 6,451,712 B1 * 9/2002 Dalton et al. ................. 438/781
7,253,105 B2 * 8/2007 Dimitrakopoulos et al. . 438/674

* cited by examiner

*Primary Examiner* — Jasmine Clark
(74) *Attorney, Agent, or Firm* — Jones Day

(57) ABSTRACT

A method of fabricating an interconnect structure on a wafer and an interconnect structure are provided. A dielectric layer is provided on the wafer. An interconnect is formed by etching a recess into the dielectric layer, where the etching utilizes a hard mask that includes a first layer deposited over the dielectric layer. The interconnect is planarized using a chemical mechanical polishing (CMP) process, where the first layer remains on the dielectric layer at a completion of the CMP process. The first layer or a portion of the first layer is transformed into a nitride layer or an oxide layer after the CMP process.

18 Claims, 8 Drawing Sheets

HARD MASK FOR BACK-END-OF-LINE (BEOL) INTERCONNECT STRUCTURE

TECHNICAL FIELD

The technology described in this disclosure relates generally to integrated circuits and more particularly to a hard mask for a back-end-of-line (BEOL) interconnect structure.

BACKGROUND

Integrated circuits (ICs) generally include a plurality of semiconductor devices (transistors, capacitors, resistors, etc.). Back-end-of-line (BEOL) processing is used to interconnect the plurality of semiconductor devices with wiring on the wafer and is also used to form contacts, insulating layers (dielectrics), metal levels, and bonding sites for chip-to-package connections. BEOL interconnects, including metal wiring lines and inter-level vias, carry direct current (DC) in the integrated circuits. Within BEOL interconnect structures, metal wiring lines run parallel to the substrate, and conductive vias run perpendicular to the substrate, with the conductive vias interconnecting different levels of the metal wiring lines. Typically, copper is used as the interconnect metal in BEOL interconnect structures, due to the higher conductivity of copper as versus metals such as aluminum.

SUMMARY

The present disclosure is directed to a method of fabricating an interconnect structure on a wafer and an interconnect structure. In a method of fabricating an interconnect structure on a wafer, a dielectric layer is provided on the wafer. An interconnect is formed by etching a recess into the dielectric layer, where the etching utilizes a hard mask that includes a first layer deposited on the dielectric layer. The interconnect is planarized using a chemical mechanical polishing (CMP) process, where the first layer remains on the dielectric layer at a completion of the CMP process. The first layer or a portion of the first layer is transformed into a nitride layer or an oxide layer after the CMP process.

In another example, an interconnect structure includes a dielectric layer, where the dielectric layer comprises a low-k dielectric material. The interconnect structure further includes an interconnect formed by etching a recess into the dielectric layer and a planar surface formed by a chemical mechanical polishing (CMP) process. The interconnect structure also includes a hard mask that includes a first layer deposited on portions of the dielectric layer, where the hard mask masks the portions of the dielectric layer during the etching. The first layer remains on the portions of the dielectric layer at a completion of the CMP process, and the first layer or a portion of the first layer is transformed into a nitride layer or an oxide layer after the completion of the CMP process.

DETAILED DESCRIPTION

Figure 1:
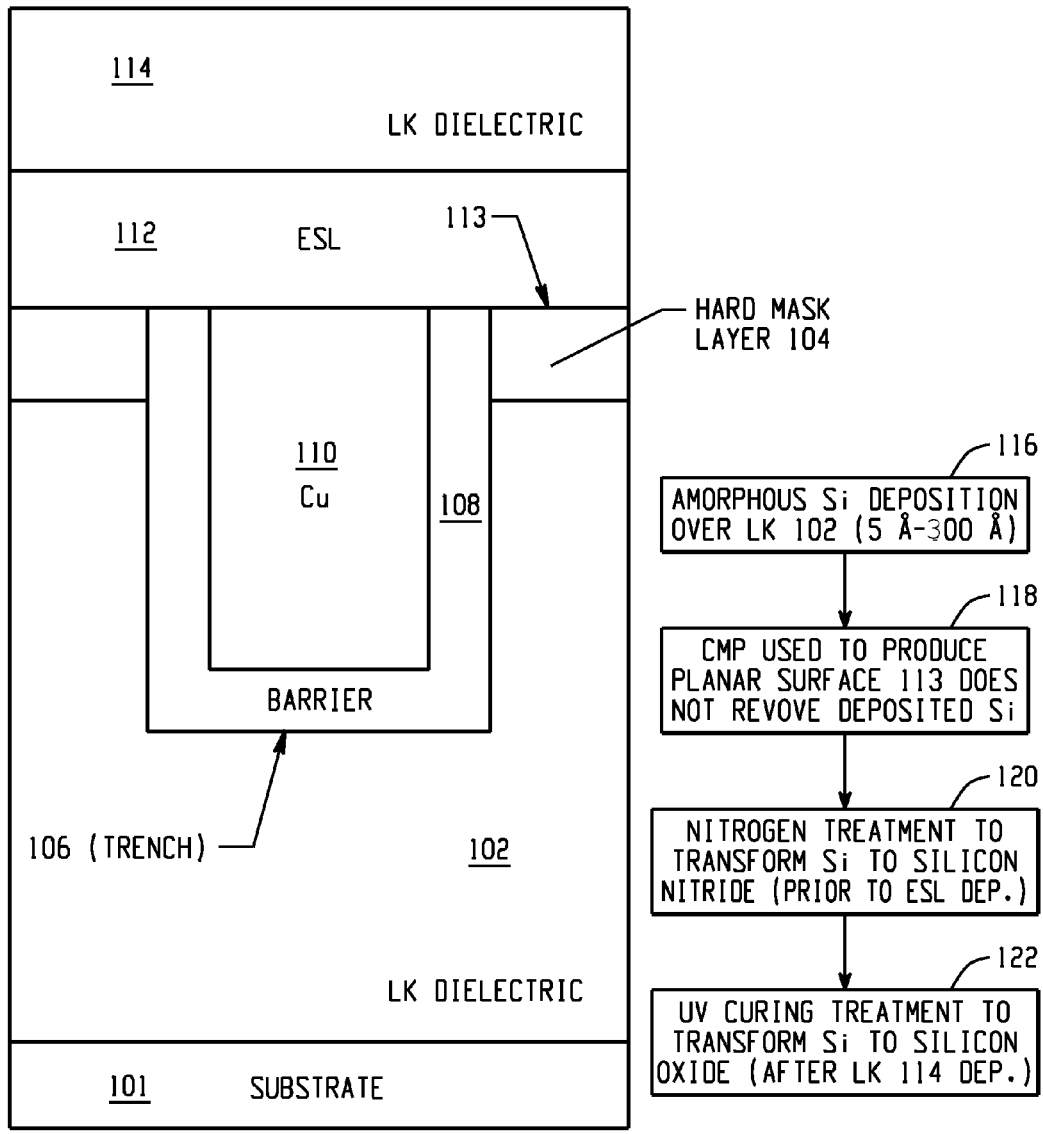
FIG. 1 depicts an example interconnect structure formed on a substrate, where the example interconnect structure includes a hard mask layer.

FIG. 1 depicts an example interconnect structure formed on a substrate 101, where the example interconnect structure includes a hard mask layer 104. In FIG. 1, the example interconnect structure includes a low-k dielectric layer 102 having a trench (i.e., recess) 106. The trench 106 in the low-k dielectric layer 102 may be fabricated using an etching technique (e.g., a wet etch or a dry etch). The low-k dielectric layer 102 may comprise SiOC material (e.g., SiOC having a dielectric constant k of between approximately 2.0 and 3.5) or another material having a dielectric constant k that is less than 3.9. The example interconnect structure further includes a barrier layer 108 and a conductive layer 110 that are deposited in the recess 106 substantially over the low-k dielectric layer 102. The barrier layer 108 may be deposited in a manner that causes sidewalls and a bottom of the recess 106 to be substantially coated. The conductive layer 110 may be deposited to coat the sidewalls and the bottom of the recess 106 and to also completely fill the recess 106 (i.e., the conductive layer 110 may be deposited using a metal fill technique). In the example of FIG. 1, the barrier layer 108 may be comprised of various materials including TiN, TaN, WN, RuTa(N), and RuN, and the conductive layer 110 comprises copper (Cu).

Prior to deposition of an etch stop layer (ESL) 112 and a second low-k dielectric layer 114, the example interconnect structure of FIG. 1 may undergo a planarization procedure (e.g., via chemical mechanical polishing or chemical mechanical planarization (CMP)) that forms a substantially planar surface 113. The ESL 112 is deposited substantially over the planar surface 113, and the second low-k dielectric layer 114 is deposited substantially over the ESL 112. The ESL 112 may be formed using insulating materials including SiCN, SiN, SiC, SiCO, and $SiO_2$, and may be deposited using a chemical vapor deposition (CVD) process, a physical vapor deposition (PVD) process, or an atomic layer deposition (ALD) process, for example. The ESL 112 may include material or materials that are resistant to an etchant, where the etchant is used to remove one or more layers of the structure (e.g., the second low-k dielectric layer 114 deposited above the ESL 112 or the low-k dielectric layer 102 below the ESL 112). The second low-k dielectric layer 114 may be comprised of a material that is the same as or similar to that of the dielectric layer 102 (e.g., SiCOH, as one non-limiting example, or another material having a dielectric constant k that is less than 3.9).

In etching the trench 106 in the low-k dielectric 102, the hard mask layer 104 may be used to mask portions of the dielectric layer 102 during the etching. As illustrated in FIG. 1, portions of the hard mask layer 104 remain on the low-k dielectric layer 102 at the completion of the CMP planarization procedure. To achieve this, the hard mask layer 104 may include material that functions as a CMP stop layer and is not removed by the CMP planarization procedure. Thus, the material for the hard mask layer 104 may be selected such that the CMP planarization procedure has a high selectivity that causes other materials to be substantially removed by the CMP planarization procedure while substantially preserving the hard mask layer 104. The other materials that are substantially removed by the CMP planarization procedure may include portions of the conductive layer 110, the barrier layer 106, and various other hard mask layers deposited above the hard mask layer 104.

In one example, the hard mask layer 104 may comprise amorphous silicon. In this example, prior to the CMP planarization procedure, a second hard mask layer comprising $SiO_2$, SiCO, SiC, or SiON may be deposited over the amorphous silicon hard mask layer 104 and may be used in etching the trench 106. During the CMP planarization, due to the differences between the amorphous silicon material of the hard mask layer 104 and the $SiO_2$, SiCO, SiC, or SiON material comprising the second hard mask layer, the CMP may exhibit a high selectivity and may remove the material of the second hard mask layer while substantially preserving the amorphous silicon material of the layer 104. In this manner, due to the high selectivity of the CMP procedure, the hard mask layer 104 may function as a CMP stop layer and may allow for precise trench depth control.

Additional details regarding the hard mask layer 104 are provided at steps 116, 118, 120, and 122 of FIG. 1. At 116, the hard mask layer 104 may initially comprise an amorphous silicon material that is deposited over the low-k dielectric 102 to a thickness within a range of approximately 5 Å to 300 Å. At 118, the CMP planarization procedure may be used to produce the substantially planar surface 113, and in producing the substantially planar surface 113, an entirety of the amorphous silicon material of the hard mask layer 104 is not removed. In one example, the amorphous silicon for the hard mask layer 104 is deposited to a thickness of approximately 50 Å, and following the CMP planarization procedure, the thickness of the hard mask layer 104 is equal to approximately 30 Å.

At 120, after the CMP planarization and prior to the deposition of the ESL 112, the amorphous silicon of the hard mask layer 104 may undergo a nitrogen treatment to transform the amorphous silicon into a nitride layer (e.g., a silicon nitride layer). As described in greater detail below, with reference to FIGS. 2A-2J, the transformation of the amorphous silicon into the nitride layer may increase a density of the hard mask layer 104, thus increasing the etch resistance of the hard mask layer 104. Further, the transformation of the amorphous silicon into the nitride layer may cause the interconnect structure to have a higher breakdown voltage (VBD). The VBD between the lines of the copper conductive layer 110 when multiple interconnects are fabricated on a wafer may be affected by the spacing between the copper lines and also by the quality of the low-k dielectric 102 (e.g., porosity of the low-k dielectric 102 and moisture added to the low-k dielectric 102 during the CMP procedure).

At 122, after the deposition of the ESL 112 and the second low-k dielectric 114, UV curing may be used to transform the amorphous silicon into an oxide layer (e.g., a silicon oxide layer). Similar to the effect produced by the transformation of the amorphous silicon into the silicon nitride, forming the silicon oxide via the UV curing treatment may increase a density of the hard mask layer 104, an etch resistance of the hard mask layer 104, and a breakdown voltage of the interconnect structure. In one example, the step 120 is not performed, such that the silicon nitride layer is not formed in the hard mask layer 104, and only the silicon oxide layer is formed in the hard mask layer 104. In another example, the step 122 is not performed, such that the silicon oxide layer is not formed in the hard mask layer 104, and only the silicon nitride layer is formed in the hard mask layer 104. In yet another example, both of steps 120 and 122 are performed, such that the hard mask layer 104 includes a mixture of both silicon nitride and silicon oxide.

The example interconnect structure and method of fabricating an interconnect described with reference to FIG. 1 may be used in back-end-of-line (BEOL) processing, where the BEOL processing includes interconnection of individual devices (e.g., transistors, capacitors, resistors, etc.) with wiring on the wafer, as well as formation of contacts, insulating layers, metal levels, and bonding sites for chip-to-package connections.

Figure 2A:
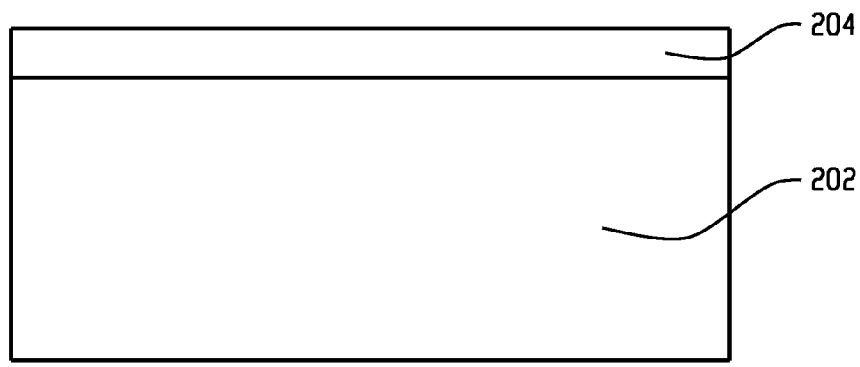
FIG. 2A shows a beginning structure used in an example method of fabricating an interconnect structure on a wafer.

FIG. 2A shows a beginning structure used in an example method of fabricating an interconnect structure on a wafer. The beginning structure includes a first layer 204 of a hard mask that is deposited on a dielectric layer 202. The first layer 204 of the hard mask may be a silicon (Si) layer. In one example, the first layer 204 is comprised of an amorphous silicon material that is deposited at a temperature that is less than approximately 500 degrees Celsius (e.g., 350 degrees Celsius) via a plasma enhanced chemical vapor deposition (PECVD) process, a physical vapor deposition (PVD) process, or an atomic layer deposition (ALD) process. The amorphous Si of the first layer 204 may have a thickness within a range of approximately 5 Å to 300 Å (e.g., 50 Å). As described below, with reference to FIGS. 2H and 2J, a density and an etch resistance of the first layer 204 comprising the amorphous silicon material may be increased via a nitrogen treatment or an ultraviolet (UV) curing process, with the increased density of the first layer 204 being used to increase a breakdown voltage of the interconnect structure.

The dielectric layer 202 is a low dielectric constant ("low-k") dielectric that may be SiCOH material or SiOC material (e.g., SiOC having a dielectric constant k of between approximately 2.0 and 3.5), for example. The low-k dielectric layer 202 may be used as an interlevel dielectric (ILD) layer in the interconnect structure and may be used to electrically separate closely spaced interconnect lines in a multilevel metallization scheme. The low-k material used in the dielectric layer 202 may have a dielectric constant k lower than 3.9 in order to reduce undesired capacitive coupling, and hence, "cross talk," between metal lines of the structure.

Figure 2B:
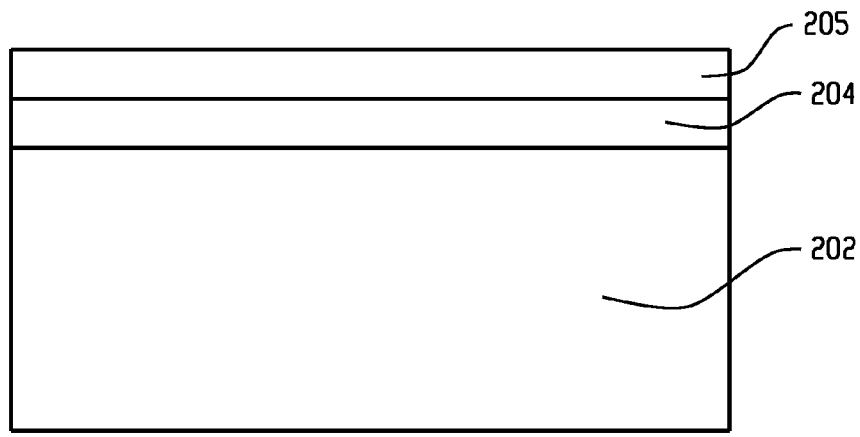
FIG. 2B shows a deposition of a second layer of a hard mask substantially over a first layer of the hard mask.

FIG. 2B shows a deposition of a second layer 205 of the hard mask substantially over the first layer 204. The second layer 205 may be comprised of $SiO_2$, SiCO, SiC, or SiON, among other conventional hard mask materials. In one example, the second layer 205 is comprised of a dielectric material or an inter-metal/metal material (e.g., TiN or Ti), or alternatively, a combination of a dielectric material and an inter-metal/metal material. As described in further detail below, with reference to FIG. 2F, various properties of the first and second layers 204, 205 of the hard mask may differ. Due to the different properties of the first layer 204 (i.e., the amorphous silicon layer) and the second layer 205 (i.e., the layer comprised of a typical dielectric hard mask material), a chemical mechanical polishing or chemical mechanical planarization (CMP) process performed on the structure may exhibit a high selectivity, such that the CMP process may substantially remove the second layer 205 while substantially preserving the first layer 204 on the low-k dielectric 202. Further, due to the different properties of the different layers 204, 205, the first layer 204 may function as a CMP stop layer (i.e., the CMP process removes the second layer 205 but may not remove the first layer 204, thus effectively causing the CMP process to substantially stop at the first layer 204).

Figure 2C:
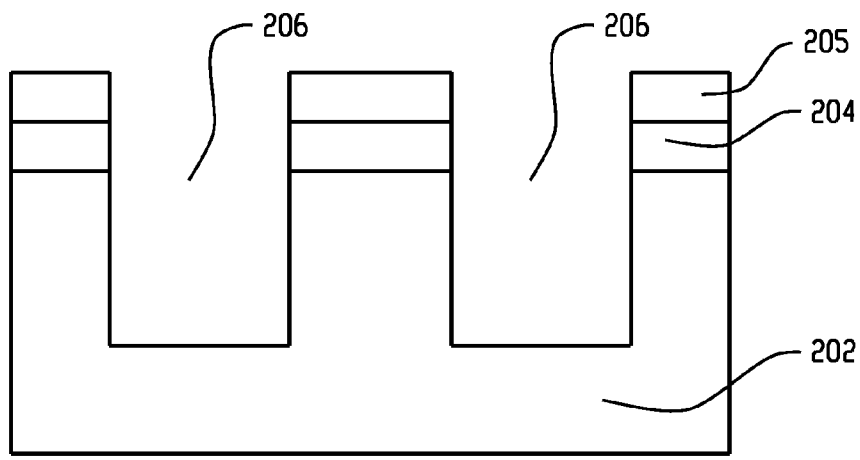
FIG. 2C shows recesses etched into a low-k dielectric layer and the hard mask layers.

FIG. 2C shows recesses 206 etched into the low-k dielectric layer 202 and the hard mask layers 204, 205. The recesses 206 are trenches that may be formed using a lithography process (e.g., photolithography or electron beam lithography) and an etching process. For example, a photoresist may be applied over the second layer 205 of the hard mask and exposed to light to form openings in the photoresist. Using the photoresist as a mask, the layers 204, 205 of the hard mask may be etched to transfer the pattern in the photoresist to the layers 204, 205. With the first and the second layers 204, 205 of the hard mask patterned in this manner, the layers 204, 205 can function as an etch mask in etching the low-k dielectric layer 202. For example, after patterning the hard mask layers 204, 205, a wet etch (e.g., a buffered hydrofluoric acid etch) or a dry etch (e.g., reactive ion etching (RIE)) may be used to form the recesses 206 in the low-k dielectric layer 202.

Figure 2D:
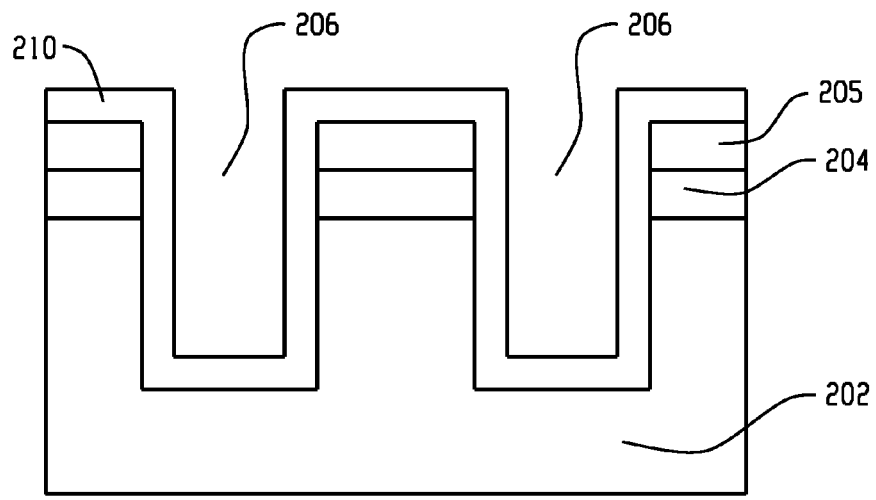
FIG. 2D shows a barrier layer deposited in recesses of the interconnect structure.

FIG. 2D shows a barrier layer 210 deposited in the recesses 206. The barrier layer 210 may be a cap layer that prevents a metal that is subsequently deposited in the recesses 206 (e.g., copper) from diffusing into the low-k dielectric layer 202. The barrier layer 210 may be, for example, TiN, TaN, WN, RuTa(N) or RuN, and the deposition process used to deposit the barrier layer may be, for example, chemical vapor deposition (CVD), physical vapor deposition (PVD), or atomic layer deposition (ALD). In one example, the barrier layer 210 has a thickness within a range of approximately 20 Å to 100 Å. The recesses 206 may include sidewalls that are substantially vertical, and the process and parameters used in depositing the barrier layer 210 may be selected to cause the sidewalls and the bottoms of the recesses 206 to be substantially covered with the material of the barrier layer 210.

Figure 2E:
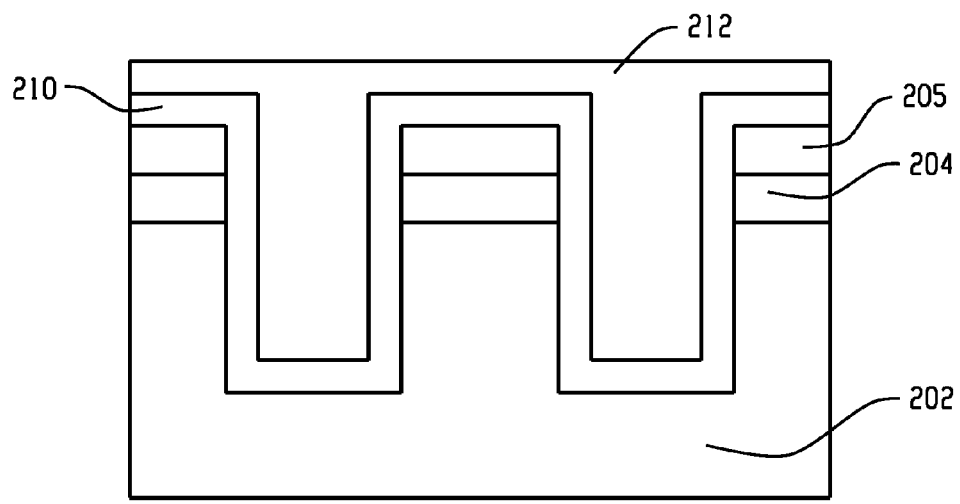
FIG. 2E shows a conductive layer deposited in the recesses over the barrier layer.

FIG. 2E shows a conductive layer 212 deposited in the recesses 206 substantially over the barrier layer 210. In the example of FIG. 2E, the conductive layer 212 substantially fills the recesses 206, thus forming the conductive portion of an interconnect. The conductive layer 212 may be comprised of, for example, copper (Cu) or Cu(Al).

Figure 2F:
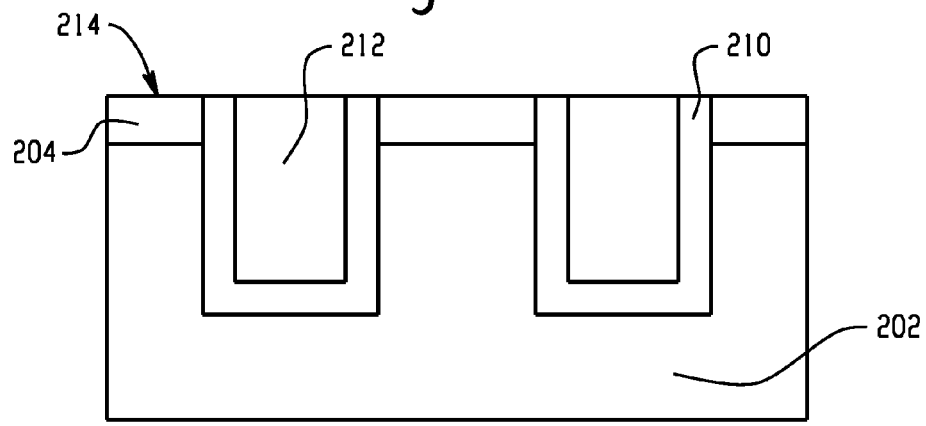
FIG. 2F shows a planarization of the interconnect structure.

FIG. 2F shows a planarization of the structure. The planarization of the structure may be accomplished via a chemical mechanical planarization or chemical mechanical polishing (CMP), which is a process of smoothing a surface using a combination of chemical and mechanical forces. The planarizing of the structure may cause portions of the barrier layer 210 and the conductive layer 212 to be exposed at a top surface 214 of the substantially planarized structure. In the planarization of the structure depicted in FIG. 2F, the second layer 205 of the hard mask is substantially removed by the planarization process, but the first layer 204 of the hard mask (i.e., the amorphous silicon layer) is substantially preserved on the dielectric layer 202. The CMP process may thus exhibit a selectivity in the removal of the layers 204, 205 that is due to the different properties of the layers 204, 205. As explained above, the first layer 204 may be an amorphous silicon layer, and the second layer 205 may be a typical hard mask dielectric material (e.g., $SiO_2$, SiCO, SiON, or SiC), an inter-metal/metal material (e.g., TiN or Ti), or a combination of the dielectric material and the inter-metal/metal material. The different properties of the respective layers 204, 205 may thus cause the amorphous silicon material of the first layer 204 to function as a CMP stop layer, while the second layer 205 of the hard mask may be substantially removed by the CMP process.

Figure 2G:
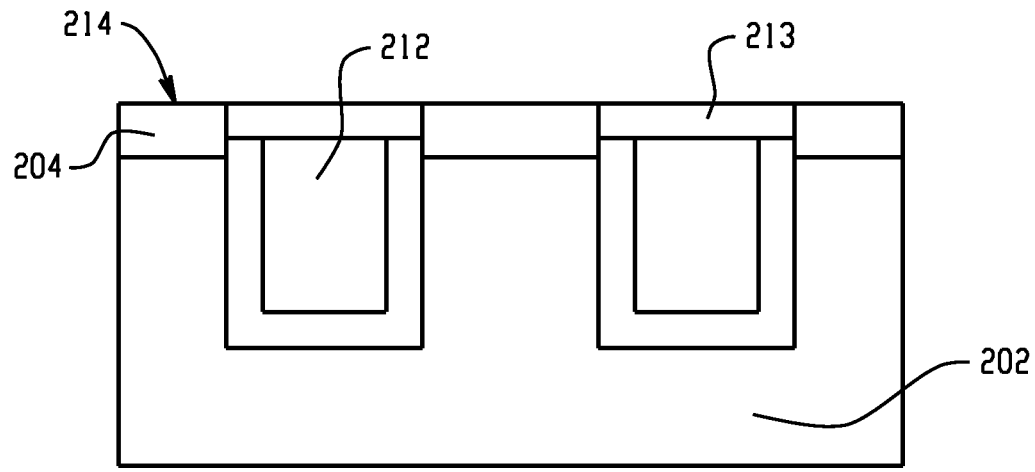
FIG. 2G shows a metal cap that is deposited substantially over an exposed copper conductive layer at a planarized surface of the structure.

FIG. 2G shows a metal cap 213 that is deposited substantially over the exposed copper conductive layer 212 at the planarized surface 214 of the structure. As illustrated in FIG. 2G, the metal cap 213 may be deposited only over the conductive layer 212 of the interconnect, such that the metal cap 213 may not be deposited on the first layer 204 of the hard mask. In one example, the metal cap is comprised of cobalt (Co).

Figure 2H:
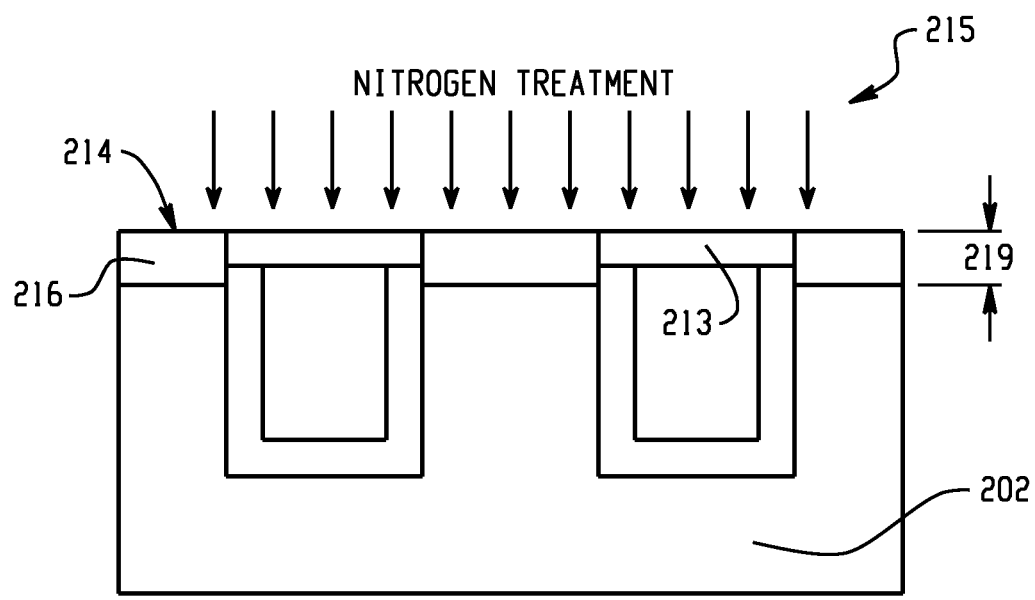
FIG. 2H shows the structure being exposed to a nitrogen treatment to substantially transform amorphous silicon of the first layer into a nitride layer.

FIG. 2H shows the structure being exposed to a nitrogen treatment to substantially transform the amorphous silicon of the first layer 204 into a nitride layer 216 (i.e., a silicon nitride layer). The nitride layer 216 may have a thickness 219 within a range of approximately 5 Å to 300 Å. In one example, an entirety of the volume of the amorphous silicon first layer 204 is transformed into the nitride layer 216, while in another example, portions of the amorphous silicon first layer 204 are not transformed into the nitride layer 216 (i.e., a thickness 219 of the nitride layer 216 is not equal to the thickness of the first layer 204, meaning that only an upper portion of the first layer 204 that is closer to the planar surface 214 exposed to the nitrogen treatment is transformed into the nitride layer 216). The nitrogen treatment depicted in FIG. 2H may occur contemporaneously with the deposition of the cobalt metal cap 213 (as described above with reference to FIG. 2G) or the nitrogen treatment may occur after the cobalt metal cap 213 deposition. The nitrogen treatment may occur prior to a deposition of an etch stop layer on the structure (as described below with reference to FIG. 2I). In one example, the nitrogen treatment and transformation of the first layer 204 to the silicon nitride layer 216 is not performed. In this example, the amorphous silicon of the first layer 204 may instead later be transformed into a silicon oxide layer, as described below with reference to FIG. 2J.

In FIG. 2H, the nitrogen treatment is performed using a nitrogen-containing plasma 215 that substantially transforms the amorphous silicon of the first layer 204 into a silicon nitride layer. The nitrogen treatment may be performed using a plasma enhanced chemical vapor deposition (PECVD) process at a temperature of 350 degrees Celsius or approximately equal to 350 degrees Celsius. The nitrogen-containing plasma 215 may use $N_2$ or $NH_3$ gases to form a $SiN_x$ layer, where x may be within a range of approximately 0.5 to 1.33, or N may be less than 60% at percentage weight (e.g., standard nitride or Si-rich nitride). The transformation of the first layer 204 from the amorphous silicon layer to the silicon nitride layer 216 may increase a density of the layer. The increase in the density may be due to, among other things, the addition of the extra nitrogen atoms to the first layer 204.

Figure 2I:
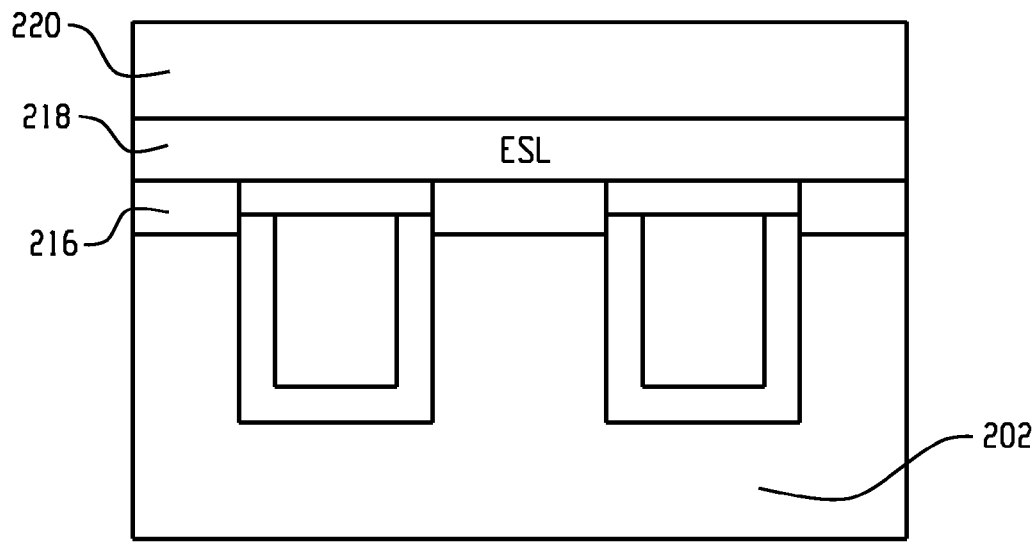
FIG. 2I shows an etch stop layer (ESL) and a second dielectric layer deposited substantially over the planarized structure.

FIG. 2I shows an etch stop layer (ESL) 218 and a second dielectric layer 220 deposited substantially over the planarized structure. The ESL 218 may be formed using insulating materials including silicon nitride, silicon carbide, and various oxides, and may be deposited using various CVD, PVD, or ALD processes. The ESL 218 may include material or materials that are resistant to an etchant, where the etchant is used to remove material from one or more layers of the structure (e.g., the dielectric layers 202, 220). The second dielectric layer 220 may be a low dielectric constant ("low-k") dielectric that may be comprised of a material that is the same as or similar to that of the dielectric layer 202 (e.g., SiCOH or SiOC). The low-k dielectric layer 220 may be used as an interlevel dielectric (ILD) layer to electrically separate closely spaced interconnect lines in a multilevel metallization scheme. Similar to the low-k dielectric layer 202, the low-k material used in the dielectric layer 220 may have a dielectric constant k lower than 3.9.

The deposition of the ESL 218 and the second dielectric layer 220 may occur after the nitrogen treatment shown in FIG. 2H. In examples in which the nitrogen treatment of FIG. 2H is not performed, the ESL 218 and the second dielectric layer 220 may be deposited substantially over the first layer 204 of the hard mask. Thus, although FIG. 2I depicts the ESL 218 and the second dielectric layer 220 as being deposited substantially over the silicon nitride layer 216, in other examples where the silicon nitride layer 216 is not formed, the ESL 218 and the second dielectric layer 220 may instead be deposited substantially over the first layer 204.

Figure 2J:
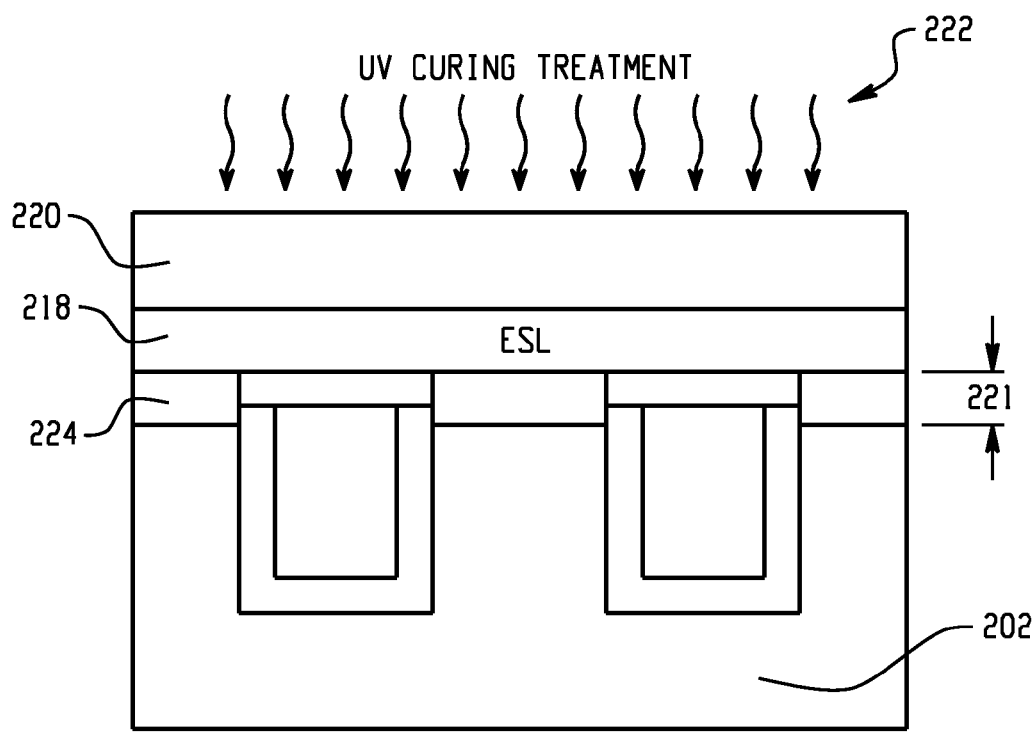
FIG. 2J shows the structure being exposed to an ultraviolet (UV) curing treatment to form an oxide layer.

FIG. 2J shows the structure being exposed to an ultraviolet (UV) curing treatment 222 to form an oxide layer 224. In examples where the silicon nitride layer 216 is not formed (i.e., examples where the nitride treatment illustrated in FIG. 2H is not performed, and the ESL 218 and the second dielectric layer 220 are deposited over the amorphous silicon first layer 204), the UV curing treatment 222 may substantially transform the amorphous silicon of the first layer 204 to the oxide layer 224 (i.e., a silicon oxide layer). In examples where the silicon nitride layer 216 is formed, the resultant layer 224 may include a mixture of oxide and nitride components (e.g., a mixture of silicon nitride from the nitrogen treatment and silicon oxide from the UV curing treatment 222). The UV curing treatment 222 may be performed after the deposition of the ESL 218 and the second dielectric layer 220.

The oxide layer 224 may have a thickness 221 within a range of approximately 5 Å to 300 Å. The oxide layer 224 may have a composition of $SiO_x$, where x is within a range of approximately 0.5 to 2.0. The UV curing treatment 222 may include exposing the structure to ultraviolet radiation having a wavelength in a range of approximately 200 nm to 400 nm. The UV curing treatment 222 may be performed at a temperature within a range of approximately 200 to 500 degrees Celsius, at a pressure within a range of approximately 1 Torr to 100 Torr, and for a length of time within a range of approximately 10 seconds to 10 minutes. The UV curing treatment 222 may be performed in the presence of a gas, where the gas may include one or more of Helium, Argon, $N_2$, $O_2$, and $O_3$ (i.e., only one of the Helium, Argon, $N_2$, $O_2$, and $O_3$ gases may be used, or alternatively, multiple of the gases may be combined in the UV treatment process 222).

In one example, the UV curing treatment 222 and transformation of the first layer 204 to the silicon oxide layer 224 are not performed. In this example, the amorphous silicon of the first layer 204 may have instead been substantially transformed into a silicon nitride layer (e.g., the silicon nitride layer 216 as described above with respect to FIG. 2H). Further, as noted above, the UV curing procedure 222 may be performed even after the first layer 204 has been transformed into the silicon nitride layer 216, thus resulting in the layer 224 that may have both silicon nitride components and silicon oxide components. In another example, the UV curing treatment 222 is not performed to form the silicon oxide layer 224, and instead, an oxygen plasma treatment is used to form the silicon oxide layer 224. The oxygen plasma treatment may be performed contemporaneously with the deposition of the ESL 218 or contemporaneously with the deposition of the second dielectric layer 220. In another example, the oxygen plasma treatment is performed prior to the depositions of the ESL 218 and the second dielectric layer 220, and in another example, the oxygen plasma treatment is performed after the ESL 218 and the second dielectric 220 layers have been deposited.

In FIGS. 2H and 2J, a density of the first layer 204, which may originally comprise an amorphous silicon material, may be increased using the nitrogen treatment and the UV curing treatment 222. In each case, a higher density film may be produced by the addition of the extra atoms that occurs via the nitrogen treatment and the UV curing treatment 222. In the nitrogen treatment (e.g., using the $N_2$ plasma treatment or the $NH_3$ plasma treatment), extra nitrogen atoms may be added to the amorphous silicon of the first layer 204, thus increasing the density of the layer 204 and forming the silicon nitride layer 216. In the UV curing treatment 222 (e.g., performed in the presence of an $O_3$ gas), extra oxygen atoms may be added to the amorphous silicon of the layer 204 or to the silicon nitride of the layer 216, thus increasing the density of the layer and forming the oxide component in the layer.

Figure 3A:
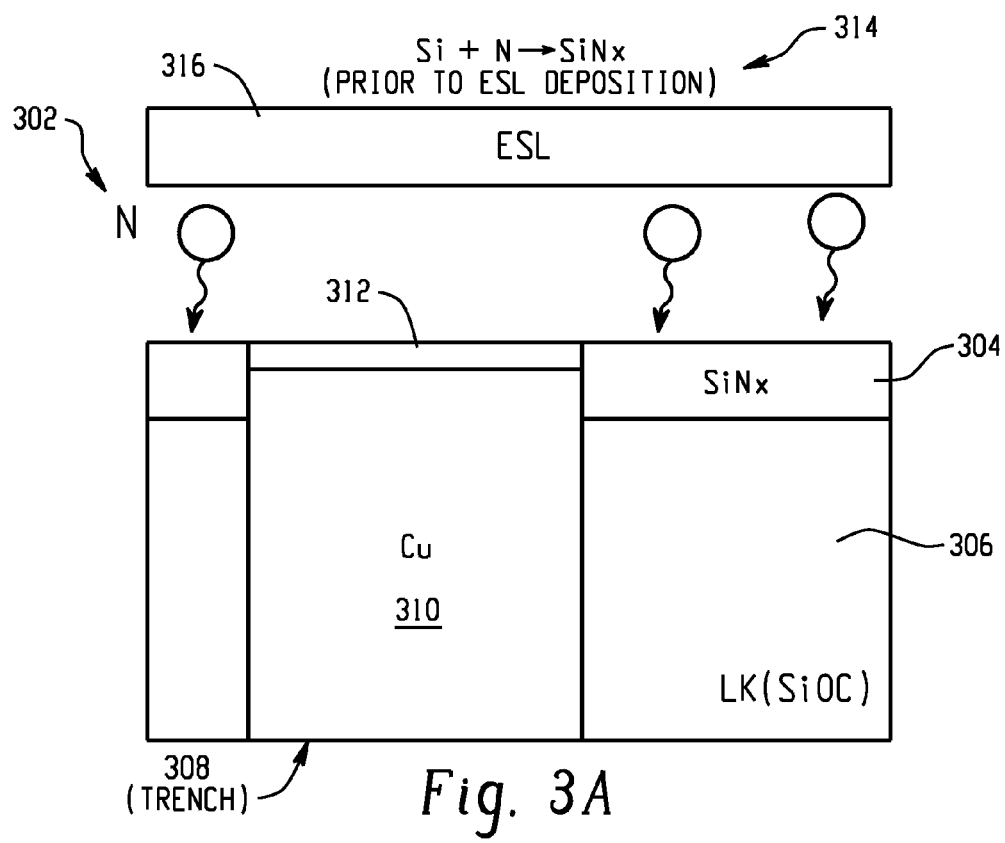
FIG. 3A illustrates aspects of a transformation of an amorphous silicon hard mask layer to a silicon nitride layer.

FIG. 3A illustrates aspects of a transformation of an amorphous silicon hard mask layer to a silicon nitride layer 304. An interconnect structure illustrated in FIG. 3A includes a hard mask that includes a silicon layer (e.g., an amorphous silicon layer), where the silicon layer may mask portions of a low-k dielectric layer 306 (comprising, for example, SiOC) to form a trench 308 in the low-k dielectric material 306. Copper (Cu) 310 may be deposited in the trench, and a cobalt (Co) cap layer may be deposited substantially over a top surface of the copper 310. After planarizing the interconnect structure using a CMP polishing procedure that does not substantially remove the silicon layer of the hard mask, the silicon layer may be transformed into the silicon nitride layer 304. As illustrated at 314, the transformation of the amorphous silicon hard mask layer to the silicon nitride layer 304 may occur prior to a deposition of an ESL layer 316 and involves adding nitrogen atoms 302 to the amorphous silicon to form the silicon nitride 304 (i.e., Si+N yields $SiN_x$, as illustrated at 314). The nitrogen atoms 302 may be added via a nitrogen plasma treatment, where the nitrogen plasma treatment may use an $N_2$ plasma or an $NH_3$ plasma to form the silicon nitride 304 having a composition of $SiN_x$, where x is within a range of approximately 0.5 to 1.33. The nitrogen plasma treatment may be administered using a plasma enhanced chemical vapor deposition (PECVD) at a temperature equal to approximately 350 degrees Celsius. The thickness of the silicon nitride layer 304 may be within a range of approximately 5 Å to 300 Å (e.g., 30 Å in one example).

Figure 3B:
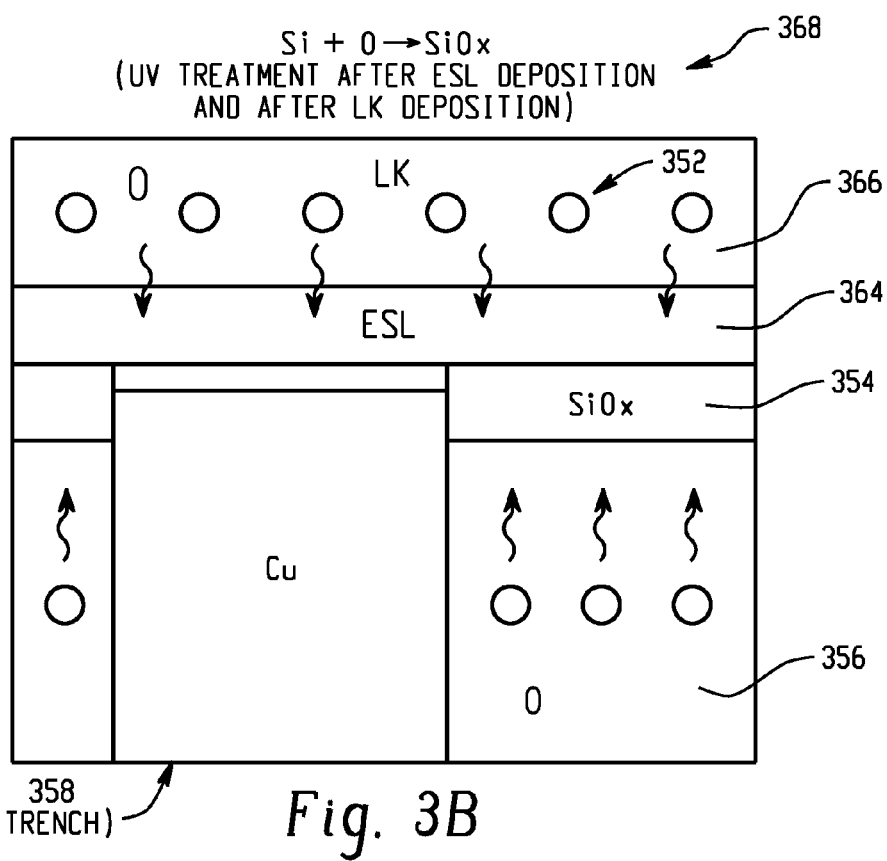
FIG. 3B illustrates aspects of a transformation of an amorphous silicon hard mask layer to a silicon oxide layer.

FIG. 3B illustrates aspects of a transformation of an amorphous silicon hard mask layer to a silicon oxide layer 354. An interconnect structure illustrated in FIG. 3B includes a hard mask that includes a silicon layer that may be used in etching a trench 358 in a low-k dielectric layer 356. As indicated at 368, the transformation of the silicon layer to the silicon oxide layer 354 may occur after a deposition of an ESL layer 364 and a second low-k dielectric layer 366 and may involve adding oxygen atoms 352 to the amorphous silicon to form the silicon oxide 354 (i.e., Si+O yields $SiO_x$, as illustrated at 368). The oxygen atoms 352 may be added via an oxygen plasma treatment, where the oxygen plasma treatment may use an $O_2$ plasma or an $O_3$ plasma to form the silicon oxide 354. Alternatively, the oxygen atoms 352 may be added via a UV curing process, where the oxygen atoms may be provided in an environment used in the UV curing process or from the low-k materials of the layers 356, 366. In one example, the UV treatment is performed using a plasma enhanced chemical vapor deposition (PECVD) process at a temperature of approximately 350 degrees Celsius and in the presence of an environment that includes $O_3$. The silicon oxide layer 354 may have composition of $SiO_x$, where x may be within a range of approximately 0.5 to 2.0. The thickness of the silicon oxide layer 354 may be within a range of approximately 5 Å to 300 Å (e.g., 30 Å in one example).

Figure 4:
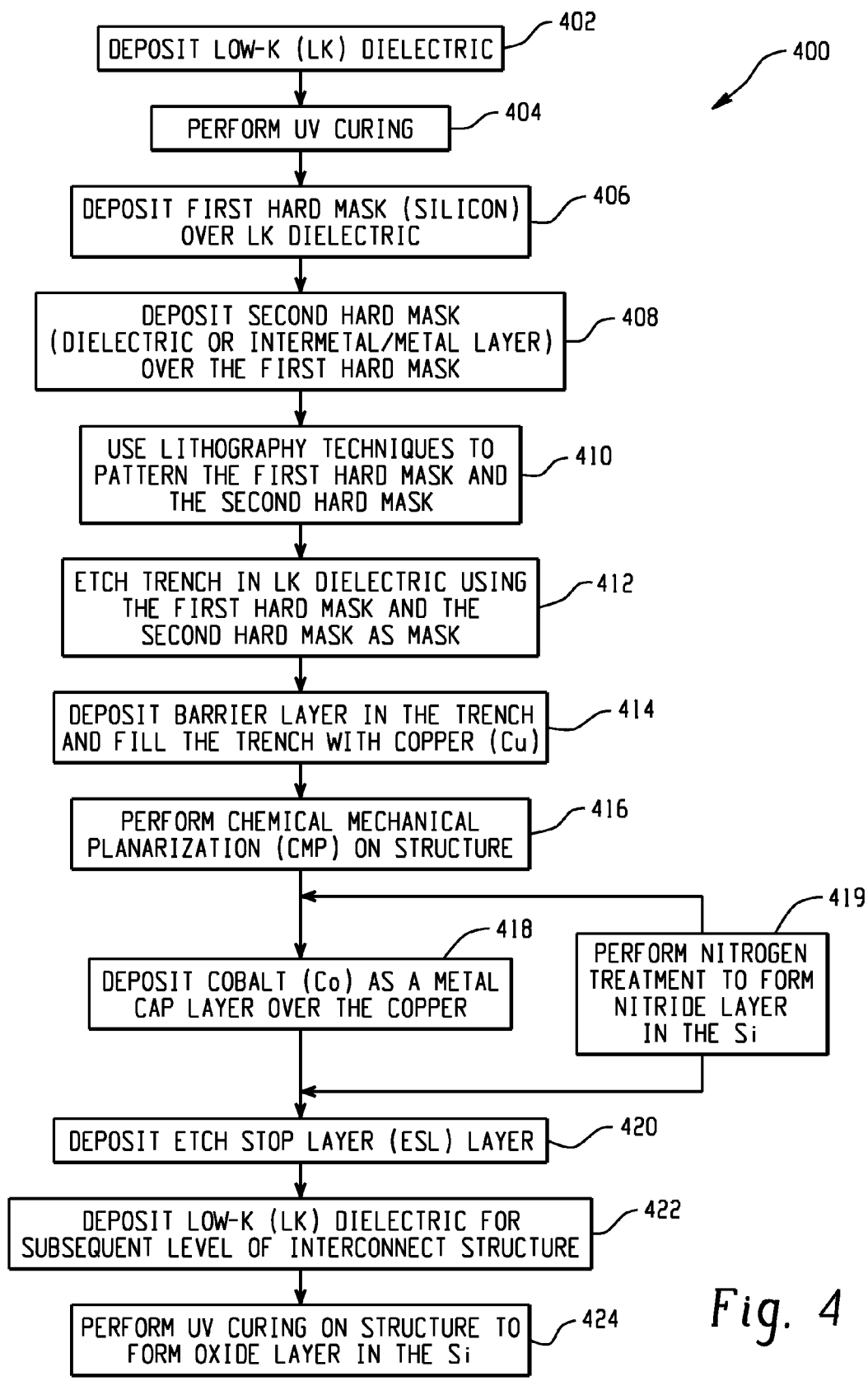
FIG. 4 is a flowchart illustrating an example method of using a multiple-layer hard mask structure for BEOL processing.

FIG. 4 is a flowchart 400 illustrating an example method of using a multiple-layer hard mask structure for back-end-of-line (BEOL) processing. At 402, a low-k dielectric material (e.g., SiOC having a dielectric constant k within a range of approximately 2.0 to 3.5) is deposited. At 404, an ultraviolet (UV) curing procedure may be performed on the deposited low-k dielectric material. At 406, a first hard mask layer comprising amorphous silicon is deposited substantially over the low-k dielectric material. In one example, the amorphous silicon hard mask layer is deposited to a thickness of 50 Å. At 408, a second hard mask layer may be deposited over the first hard mask layer. The second hard mask layer may comprise a dielectric material (e.g., $SiO_2$, SiCO, SiC, or SiON), an inter-metal or metal material (e.g., TiN or Ti), or a combination of the dielectric material and the inter-metal or metal material.

At 410, a lithography technique (e.g., photolithography) may be used to pattern the first hard mask layer and the second hard mask layer. At 412, a trench may be etched in the low-k dielectric material using the patterned first and second hard mask layers as masks. At 414, a barrier layer may be deposited in the trench, and following deposition of the barrier layer, the trench may be substantially filled with copper (Cu). At 416, chemical mechanical planarization (CMP) may be performed on the structure. The CMP may remove portions of the copper layer and entireties of the barrier layer and the second hard mask layer but may not remove an entirety of the amorphous silicon first hard mask layer. In one example, where the amorphous silicon first hard mask layer is deposited to a thickness of 50 Å, the amorphous silicon first hard mask layer has a thickness of 30 Å at a completion of the CMP. At 418, cobalt (Co) may be deposited as a metal cap layer over portions of the copper that are exposed at the planarized surface of the structure.

At 419, a nitrogen treatment may be performed to form a silicon nitride layer in the amorphous silicon first hard mask layer. As depicted in FIG. 4, the nitrogen treatment may be performed prior to the deposition of the cobalt metal cap layer, or the nitrogen treatment may be performed following the deposition of the cobalt metal cap layer. In other examples, the nitrogen treatment is not performed, and the amorphous silicon first hard mask layer is not transformed into the silicon nitride layer. At 420, an etch stop layer (ESL) may be deposited over the structure, and at 422, a second low-k dielectric layer may be deposited over the ESL.

At 424, ultraviolet (UV) curing may be performed on the structure to form an oxide layer in the amorphous silicon first hard mask layer. In one example, the UV curing is performed following the deposition of the ESL but prior to the deposition of the second low-k dielectric layer. In another example, the UV curing is performed after both of the ESL and the second low-k dielectric layers have been deposited. In other examples, the UV curing is not performed, and the silicon oxide is not formed in the first hard mask layer. Further, if the silicon nitride layer has been formed in the first hard mask layer, the UV curing may be used to add an oxide component to the silicon nitride layer, such that the resultant layer includes both silicon nitride components and silicon oxide components.

Figure 5:
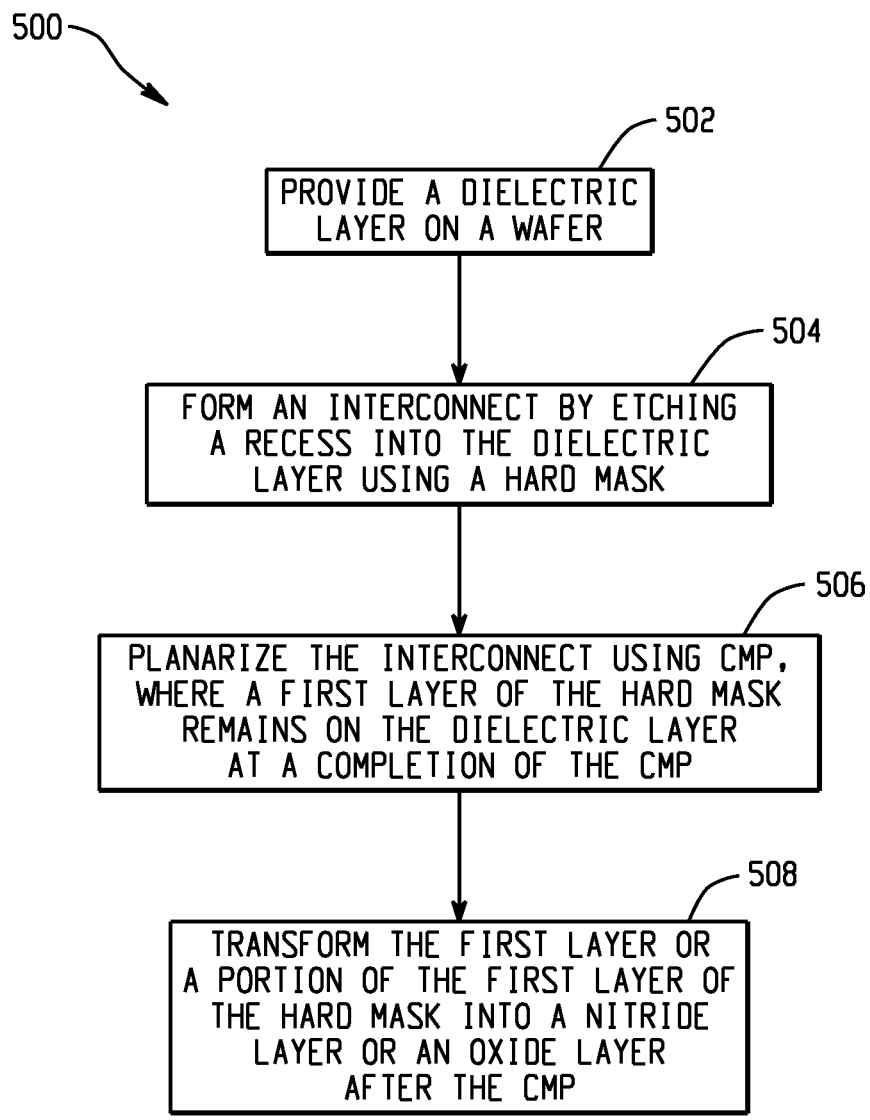
FIG. 5 is a flowchart illustrating an example method of fabricating an interconnect structure on a wafer.

FIG. 5 is a flowchart illustrating an example method of fabricating an interconnect structure on a wafer. At 502, a dielectric layer may be provided on the wafer. At 504, an interconnect may be formed by etching a recess into the dielectric layer. The etching utilizes a hard mask that may include a first layer deposited on the dielectric layer. At 506, the interconnect may be planarized using a chemical mechanical polishing (CMP) process, where the first layer substantially remains on the dielectric layer at a completion of the CMP process. At 508, the first layer or a portion of the first layer may be transformed into a nitride layer or an oxide layer after the CMP process.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

The invention claimed is:

1. A method of fabricating an interconnect structure on a wafer, the method comprising:
   providing a dielectric layer on the wafer;
   forming an interconnect by-etching a recess into the dielectric layer, the etching utilizing a hard mask that includes a first layer deposited on the dielectric layer;
   planarizing the interconnect and the hard mask using a chemical mechanical polishing (CMP) process, wherein the first layer of the hard mask substantially remains on the dielectric layer at a completion of the CMP process; and
   performing a converting process by selectively converting at least a portion of the first layer into at least one of a nitride-containing layer and an oxide-containing layer after the CMP process.

2. The method of claim 1, further comprising:
   depositing the hard mask over the dielectric layer, wherein the hard mask includes:
   the first layer deposited on the dielectric layer, and
   a second layer deposited over the first layer; and
   planarizing the interconnect using the CMP process, wherein the CMP process has a selectivity that causes the second layer to be removed by the CMP process while preserving the first layer on the dielectric layer.

3. The method of claim 1, further comprising:
   depositing the first layer over the dielectric layer, wherein the first layer is substantially a silicon (Si) layer prior to the converting process.

4. The method of claim 3, further comprising:
   providing the dielectric layer on the wafer, wherein the dielectric layer includes a low-k dielectric material;
   depositing the hard mask over the dielectric layer, wherein the hard mask includes:
   the Si layer deposited over the dielectric layer, and
   a second layer comprising $SiO_2$, SiCO, SiC, or SiON deposited over the Si layer;
   patterning the Si layer and the second layer of the hard mask using a lithography process;

etching the recess into the dielectric layer using the patterned hard mask;

forming the interconnect by filling the recess with a conductive material; and planarizing the interconnect using the CMP process, wherein the CMP process removes the second layer and portions of the conductive material, and wherein CMP process does not remove an entirety of the Si layer.

5. The method of claim 3, further comprising:

transforming at least a portion of the Si layer into the nitride-containing layer using a nitrogen plasma treatment, wherein the nitride-containing layer silicon nitride component.

6. The method of claim 5, further comprising:

depositing an etch stop layer on the planarized interconnect; and forming the nitride-containing layer using the nitrogen plasma treatment, wherein the nitrogen plasma treatment is performed after the planarizing and is performed prior to the depositing of the etch stop layer.

7. The method of claim 5, further comprising:

forming the nitride-containing layer using the nitrogen plasma treatment, wherein the nitrogen plasma treatment includes exposing the interconnect structure to an $NH_3$ plasma or an $N_2$ plasma.

8. The method of claim 7, further comprising:

exposing the interconnect structure to the $NH_3$ or the $N_2$ plasma, wherein the nitrogen plasma treatment is performed using a plasma enhanced chemical vapor deposition (PECVD) process at a temperature of 350 degrees Celsius or approximately 350 degrees Celsius, and wherein the silicon nitride layer has a composition of $SiN_x$, where x is within a range of approximately 0.5 to 1.33.

9. The method of claim 3, further comprising:

transforming at least a portion of the Si layer into the oxide layer using an oxygen plasma treatment.

10. The method of claim 3, further comprising:

transforming at least a portion of the Si layer into the oxide-containing layer using ultraviolet (UV) curing, wherein the oxide-containing layer comprises silicon oxide component.

11. The method of claim 10, further comprising:

depositing an etch stop layer on the planarized interconnect;

depositing a second dielectric layer over the etch stop layer; and converting the Si layer into the oxide-containing layer using the UV curing, wherein the UV curing is performed after the planarizing and after the depositing of the etch stop layer and the second dielectric layer.

12. The method of claim 10, further comprising:

forming the oxide-containing layer using the UV curing, wherein the UV curing includes exposing the interconnect structure to ultraviolet radiation having a wavelength in a range of approximately 200 nm to 400 nm.

13. The method of claim 10, further comprising:

using the UV curing to form the oxide-containing layer, wherein the UV curing is performed in the presence of a gas, and wherein the gas includes one or more of Helium, Argon, $N_2$, $O_2$, and $O_3$.

14. The method of claim 10, further comprising:

using the UV curing to form the silicon oxide-containing layer, wherein the UV curing is performed at a temperature within a range of approximately 200 degrees Celsius to 500 degrees Celsius, at a pressure within a range of approximately 1 Torr to 100 Torr, and for a length of time within a range of approximately 10 seconds to 10 minutes, and wherein the silicon oxide-containing layer has a composition of $SiO_x$, where x is within a range of approximately 0.5 to 2.0.

15. The method of claim 3, further comprising:

depositing the Si layer, wherein the Si layer has a thickness of approximately 50 Å; and planarizing the interconnect using the CMP process, wherein the planarizing reduces the thickness of the Si layer to approximately 30 Å.

16. The method of claim 3, further comprising:

depositing the Si layer having a thickness within a range of approximately 5 Å to 300 Å, wherein the Si layer comprises amorphous silicon.

17. The method of claim 16, further comprising:

depositing the Si layer comprising the amorphous silicon, wherein the amorphous silicon is deposited at a temperature of less than 500 degrees Celsius using a plasma enhanced chemical vapor deposition (PECVD) process, an atomic layer deposition (ALD) process, or a physical vapor deposition (PVD) process.

18. The method of claim 1, further comprising:

transforming the first layer or the portion of the first layer, wherein the transformed first layer includes both a silicon nitride component and a silicon oxide component.

* * * * *